United States Patent [19]

Aotsuka et al.

[11] Patent Number: 4,710,631

[45] Date of Patent: Dec. 1, 1987

[54] TEMPERATURE COMPENSATION FOR A SEMICONDUCTOR LIGHT SOURCE USED FOR EXPOSURE OF LIGHT SENSITIVE MATERIAL

[75] Inventors: Yasuo Aotsuka; Masahiro Konishi; Koji Takahashi, all of Kanagawa, Japan

[73] Assignee: Fuji Photo Film Co., Ltd., Kanagawa, Japan

[21] Appl. No.: 769,915

[22] Filed: Aug. 27, 1985

[30] Foreign Application Priority Data

Aug. 28, 1984 [JP] Japan .................... 59-179035
Aug. 29, 1984 [JP] Japan .................... 59-180131

[51] Int. Cl.$^4$ .................... G03B 27/72; G05D 25/02
[52] U.S. Cl. .................... 250/354.1; 250/205; 372/34
[58] Field of Search .................... 372/29, 34; 369/106, 369/116; 365/215; 250/205, 354.1

[56] References Cited

U.S. PATENT DOCUMENTS

| | | |
|---|---|---|
| 2,322,027 | 6/1943 | Jelley et al. . |
| 2,592,250 | 4/1952 | Philip et al. . |
| 2,688,545 | 9/1954 | Carroll et al. . |
| 2,933,390 | 4/1960 | McFall et al. . |
| 2,977,299 | 3/1961 | Joseph et al. . |
| 2,996,382 | 8/1961 | Luckey et al. . |
| 3,152,904 | 10/1964 | Sorensen et al. . |
| 3,206,313 | 9/1965 | Porter et al. . |
| 3,220,846 | 11/1965 | Tinker et al. . |
| 3,301,678 | 1/1967 | Humphlett et al. . |
| 3,367,778 | 2/1978 | Berriman . |
| 3,392,020 | 7/1968 | Yutzy et al. . |
| 3,397,060 | 8/1968 | Schwan et al. . |
| 3,447,927 | 6/1969 | Bacon et al. . |
| 3,457,075 | 7/1969 | Morgan et al. . |
| 3,522,052 | 7/1970 | Shiba et al. . |
| 3,527,641 | 9/1970 | Nakazawa et al. . |
| 3,615,613 | 10/1971 | Shiba et al. . |

(List continued on next page.)

FOREIGN PATENT DOCUMENTS

| | | |
|---|---|---|
| 43-4936 | 2/1968 | Japan . |
| 43-10791 | 5/1968 | Japan . |
| 49-13224 | 2/1974 | Japan . |
| 50-17216 | 2/1975 | Japan . |
| 50-32928 | 3/1975 | Japan . |
| 50-22625 | 3/1975 | Japan . |
| 50-62635 | 5/1975 | Japan . |
| 51-42529 | 4/1976 | Japan . |
| 51-59943 | 5/1976 | Japan . |
| 51-39853 | 10/1976 | Japan . |
| 52-109925 | 9/1977 | Japan . |
| 52-110618 | 9/1977 | Japan . |
| 53-12375 | 2/1978 | Japan . |
| 53-32737 | 3/1978 | Japan . |
| 57-151933 | 9/1982 | Japan . |
| 177534 | 10/1983 | Japan .................... 369/116 |
| 59-83154 | 5/1984 | Japan . |
| 59-119960 | 7/1984 | Japan . |
| 59-152440 | 8/1984 | Japan . |
| 59-168440 | 9/1984 | Japan . |
| 59-154445 | 9/1984 | Japan . |

(List continued on next page.)

Primary Examiner—Janice A. Howell
Assistant Examiner—Constantine Hannaher
Attorney, Agent, or Firm—Sughrue, Mion, Zinn, Macpeak & Seas

[57] ABSTRACT

An image forming method for exposing a light-sensitive material with a semiconductor light source whereby temperature-dependent variations in the radiation intensity and spectral characteristics of the light source are fully compensated for so as to maintain constant exposure conditions. For this purpose, correction coefficients for ambient temperature dependent variations in the radiation intensity and spectral characteristics of the semiconductor light source are stored in a memory as tabulated data. In response to the measured ambient temperature, a correction coefficient is read from the memory and applied to compensate for any variations in the radiation intensity and spectral characteristics of the semiconductor light source. Also, the correction can be effected in accordance with the measured temperature of the light source, that measurement being performed by detecting a change in the forward bias supplied to the semiconductor light source.

3 Claims, 13 Drawing Figures

FOREIGN PATENT DOCUMENTS

| | | |
|---|---|---|
| 3,615,641 | 10/1971 | Shiba et al. . |
| 3,617,293 | 11/1971 | Shiba et al. . |
| 3,617,295 | 11/1971 | Shiba et al. . |
| 3,628,964 | 12/1971 | Shiba et al. . |
| 3,634,089 | 1/1972 | Hamb . |
| 3,635,721 | 1/1972 | Sato et al. . |
| 3,666,480 | 5/1972 | Shiba et al. . |
| 3,669,670 | 6/1972 | Haist et al. . |
| 3,672,898 | 6/1972 | Schwaan et al. . |
| 3,679,428 | 7/1972 | Shiba et al. . |
| 3,700,458 | 10/1972 | Lindholm . |
| 3,703,377 | 11/1972 | Sakazume et al. . |
| 3,725,070 | 4/1973 | Hamb et al. . |
| 3,743,510 | 7/1973 | Nakazawa et al. . |
| 3,769,301 | 10/1973 | Olin et al. . |
| 3,814,609 | 6/1974 | Shiba et al. . |
| 3,837,862 | 9/1974 | Shiba et al. . |
| 3,839,041 | 10/1974 | Hiller . |
| 3,844,788 | 10/1974 | Burness et al. . |
| 3,877,940 | 4/1975 | Ericson . |
| 3,893,859 | 7/1975 | Burness et al. . |
| 3,985,565 | 10/1976 | Gabrielsen et al. . |
| 4,012,260 | 3/1977 | Dickerson et al. . |
| 4,022,617 | 5/1977 | McGuckin . |
| 4,026,707 | 5/1977 | Obikawa et al. . |
| 4,060,420 | 11/1977 | Merkel et al. . |
| 4,088,496 | 5/1978 | Merkel . |
| 4,220,709 | 9/1980 | deMauriac . |
| 4,235,957 | 11/1980 | Kohrt et al. . |
| 4,243,952 | 1/1981 | Patterson .............................. 372/29 |
| 4,375,067 | 2/1983 | Kitamura ............................ 346/160 |

FOREIGN PATENT DOCUMENTS

| | | |
|---|---|---|
| 59-157637 | 9/1984 | Japan . |
| 59-180537 | 10/1984 | Japan . |
| 59-174834 | 10/1984 | Japan . |
| 59-195237 | 11/1984 | Japan . |

TEMPERATURE COMPENSATION FOR A SEMICONDUCTOR LIGHT SOURCE USED FOR EXPOSURE OF LIGHT SENSITIVE MATERIAL

BACKGROUND OF THE INVENTION

The present invention relates to an image forming method, and more particularly, to a method of forming an image on a light-sensitive material by exposing it under light from a semiconductor light source such as a light-emitting diode.

Techniques of image exposure of light-sensitive materials by scanning with semiconductor light sources such as light-emitting diodes (LED) and semiconductor lasers are described in many prior art references such as Unexamined Published Japanese Patent Application No. 151933/1982 Proc. of SPIE, 390, 149–154 (1983).

A light-emitting diode is a device that converts electricity to optical radiation by causing a forward current to flow through the circuit across the p-n junction of a semiconductor. Depending on the specific composition, light-emitting diodes emit electromagnetic radiation in a broad spectrum of wavelengths ranging from infrared to visible spectral regions. Light-emitting diodes can be made from a variety of semiconductor compounds such as GaAs (emitting infrared light), GaAsP (red), GaAsP:N (red, yellow), GaAlAs (infrared, red), GaN (blue), SiC (blue) and GaP (red, green). Using such semiconductor light sources, light-sensitive materials may be exposed for image formation by the following procedures: electrical signals for pictures either taken by video cameras or transmitted from TV stations, or electrical signals for original scenes picked up by light-receiving devices such as photoelectric tubes and CCDs (the latter type of electrical signals may be stored in a memory for further video processing), the electrical signals are used to control the radiation from light-emitting diodes or semiconductor lasers, and in synchronism with such signals, either a light-sensitive material of interest or such light sources or both are moved for exposure by scanning.

Semiconductor light sources have such distinct advantages over conventional light sources as small size, long life and low price. However, the radiation characteristics of semiconductor light sources are subject to variations in response to variations in the temperature at which the device is used (e.g., variations in the temperature of the device due to an external heat source or seasonal variations in the ambient temperature) or the self-heating of the device as a result of current flowing through it.

The first characteristic that is subjected to such changes is the radiation wavelength. Generally, a shift to a longer wavelength occurs as a result of self-heating of the device or an increase in the external temperature. The shift in radiation wavelength may be accompanied by a change in the half-value width, but more often is characterized by a shift of peak spectral radiation. For example, each increase of 1° C. in the temperature of a light-emitting diode (whether the cause is self-heating or an external factor) will shift the peak spectral radiation to a longer wavelength by an approximate amount of 0.4 nm in a GaAlAs infrared light-emitting diode, 0.17 nm in a GaAlAs red light-emitting diode, and 0.1 nm in a GaP green light-emitting diode.

The second characteristic that is influenced by temperature variations is the radiation intensity of the semiconductor light source. For example, as the temperature of a light-emitting diode increases by 1° C., its radiation intensity (L) may drop by $\Delta \log L \cong 0.002$–$0.003$.

Therefore, if the temperature of a light-emitting diode increases by 7° C., the overall change in the amount of exposure (E) to which a light-sensitive material of interest is subjected will reach an approximate value of $\Delta \log E \cong 0.1$–$0.2$, taking into consideration the shift in radiation wavelength and the drop in radiation intensity. This value is due only to the temperature increase caused by self-heating of the diode, and will in actual cases be much greater because temperature increases due to external factors must also be allowed for.

If semiconductor light sources undergo such changes in their characteristics, they are no longer capable of providing the proper exposure for a light-sensitive material of interest and will cause such undesired effects as a reduced image density, uneven image density, and in the case of a color photographic material, fluctuations in the color balance of the formed image.

A method has been proposed for eliminating these problems by using a heater with which the temperature of the semiconductor light source can be held constant. However, this method is costly because of increased energy consumption. In addition, no consideration is made of the characteristics of the light-sensitive material which is to be exposed under the semiconductor light source. It has therefore been desired to develop an exposure method that is free from the defects of the conventional technique and which makes compensation for all the temperature-related factors that must be considered.

The principle object, therefore, of the present invention is to provide an image forming method that minimizes possible variations in the density or color balance of the finally obtained image by ensuring constant exposure conditions in the face of not only temperature-dependent variations in the radiation intensity and spectral characteristics of a semiconductor light source, but also the spectral sensitivity characteristics of a light-sensitive material exposed under such light source.

SUMMARY OF THE INVENTION

The present invention provides a method of correcting a semiconductor light source so that it will provide the right amount of exposure. In accordance with the invention, a light-sensitive material can be exposed under constant conditions, and in order to do this, any variations in the radiation intensity and spectral characteristics of the semiconductor light source with respect to data obtained by the measurements of ambient temperature are compensated for in terms of temperature so that these two parameters match the spectral sensitivity characteristics of the light-sensitive material.

Furthermore, in accordance with the present invention, the object of exposing the light-sensitive material under constant conditions is achieved both by bringing the center wavelength for the variation in the peak spectral radiation of the light source into substantial agreement with the peak spectral sensitivity wavelength of the light-sensitive material and by compensating for any temperature-dependent variations in the radiation intensity of the light source.

DESCRIPTION OF THE PREFERRED EMBODIMENTS

Figure 1:
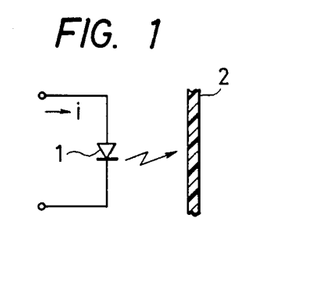
FIG. 1 shows schematically the exposure unit of a video output system to which the method of the present invention may be applied.

FIG. 1 shows schematically the exposure unit of a video output system to which the method of the present invention may be applied. An LED (light-emitting diode) 1 emits a predetermined amount of light in response to a current i for exposure of a light-sensitive material 2 positioned in a face-to-face relationship with the diode. A suitable semiconductor material for the LED may be selected from among a variety of compounds such as GaAsP (for emitting red light), GaP (red, green), GaAsP:N (red, yellow), GaAs (infrared), GaAlAs (infrared, red), GaP:N (red, green, yellow), GaAsSi (infrared), GaN (blue) and SiC (blue).

Various exposure techniques may be used. One method is described in Unexamined Published Japanese Patent Application Nos. 151933/1982 and 119960/1984; namely, a light source such as a light-emitting diode or semiconductor laser that is mounted on the periphery of a rotor in disk form is rotated and moved in the direction of its rotational axis so as to scan a light-sensitive material of interest for exposure. Another method commonly employed is one using a scanner. A drum around which a light-sensitive material of interest is wound is rotated, and a head equipped with a light source or which receives light from such source, guided by an optical fiber moved in the direction of the axis of drum rotation so as to scan the light-sensitive material for exposure.

Figure 2:
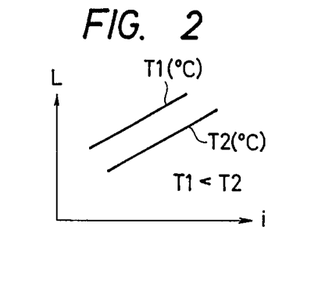
FIG. 2 is a graph showing the current vs. radiation intensity characteristics of a light-emitting diode with temperature as a parameter.
Figure 3:
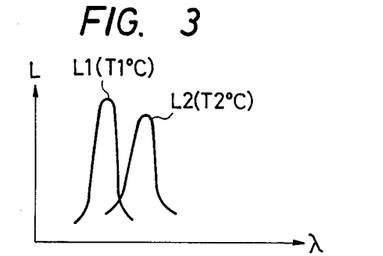
FIGS. 3 and 11 are graphs showing the temperature-dependent spectral characteristics of a light-emitting diode.
Figure 4:
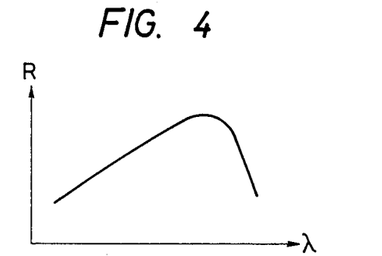
FIG. 4 is a graph showing the spectral characteristics of a light-sensitive material.

The light-emitting diode 1 has current (i) vs. radiation intensity L characteristics that depend on temperature as shown in FIG. 2. The diode also has temperature-dependent spectral characteristics as shown in FIG. 3. Therefore, if the light-sensitive material 2 to be exposed has spectral sensitivity characteristics as shown in FIG. 4 (R: sensitivity), an image of constant density cannot be obtained by simply controlling the current i so as to provide a constant value for the radiation intensity L. In other words, the radiation wavelength λ of the semiconductor light source varies as a function of the ambient temperature T and must be taken into account when controlling the radiation intensity L of the light source. If the amount of exposure given to the light-sensitive material 2, the radiation intensity of the light-emitting diode 2 at wavelength λ, and the sensitivity of the light-sensitive material 2 at wavelength λ, are respectively denoted by E, L(λ) and R(λ), the following relationship is established:

$$E = \int_{\lambda_{min}}^{\lambda_{max}} L(\lambda) \cdot R(\lambda) d\lambda \quad (1)$$

Figure 5:
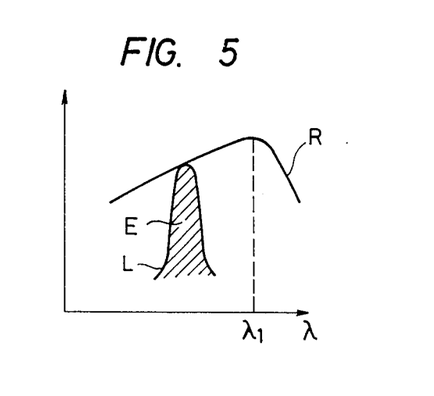
FIG. 5 is a graph showing amounts of exposure.

In FIG. 5, the amount of exposure E is indicated by the hatched area. In accordance with the principles of the present invention, any change in the ambient temperature T is compensated for by correcting the radiation intensity L(λ) in view of the sensitivity R(λ) so as to hold the exposure E at a constant level.

In a preferred embodiment, the spectral sensitivity of the light-sensitive material may be rendered substantially constant within the range of possible changes in the peak spectral radiation of the diode 1; in other words, the center wavelength for the change in the peak spectral radiation of the diode 1 may be so adjusted as to be in substantial agreement with the peak spectral sensitivity wavelength of the light-sensitive material. If these requirements are met, the amount of exposure E can be held at a substantially constant level by correcting the radiation intensity L(λ) of the light-emitting diode 1 so that it remains constant in spite of a change in ambient temperature T.

Figure 6:
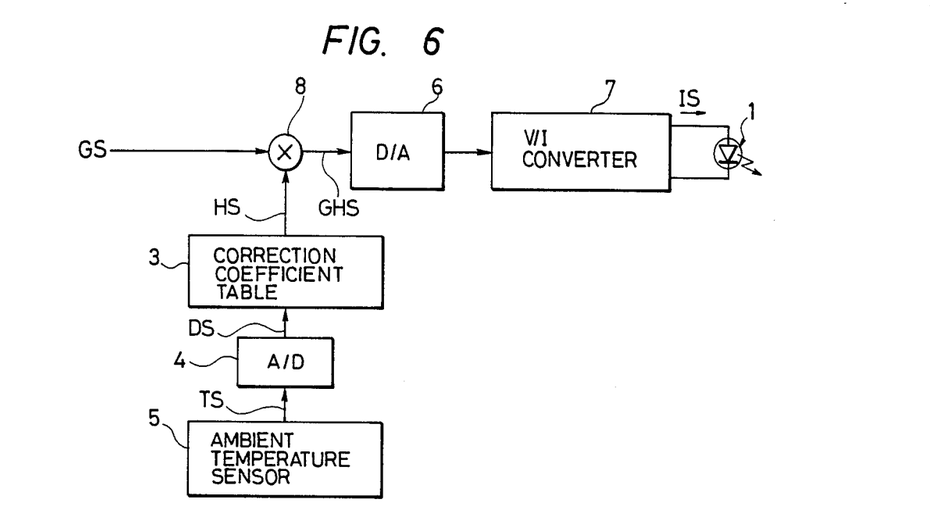
FIG. 6 is a block diagram showing one embodiment of a circuit for correcting the radiation intensity of light from a light-emitting diode.

This operating principle is employed in the circuit shown in FIG. 6, which is designed for correcting the radiation intensity of a light-emitting diode in accordance with the present invention. A picture signal GS transmitted from a video processing system is fed into a multiplier 8. An ambient temperature signal TS as obtained by an ambient temperature detector 5 is converted to a digital signal DS by an A/D converter 4. The signal DS is fed to a correction coefficient table 3 as an address signal. In response to this address signal, a correction signal HS is read out of the table 3 and applied to the multiplier 8 where it is multiplied by the video signal GS to obtain a product signal GHS, which is then fed to a D/A converter 6. The product signal GHS is converted to an analog signal by the D/A converter 6 and the result supplied to a V/I converter 7 where the analog signal is converted to a current IS for actuating the light-emitting diode 1.

The ambient temperature detector 5 may be composed of a thermo-sensitive device such as a thermistor or CTR (critical temperature resistor). Such thermo-sensitive device preferably is positioned as close to the light source as possible.

In the circuit configuration shown above, the video signal GS is continuously supplied to the multiplier 8, and the ambient temperature signal TS obtained by the temperature detector 5 is converted to temperature data DS by the A/D converter 4 and fed to the correction coefficient table 3 as a READ addressing signal. The correction table 3 is typically implemented with a memory device such as a PROM (programmable read-only memory), and is so designed that in response to a certain address that is designated, preliminarily loaded correction data are read out of the table 3. In the embodiment shown in FIG. 6, when the table receives temperature data DS as an address signal, it produces a signal HS as a correction coefficient that provides a constant exposure (E as represented by Eq. (1)) in response to the temperature data. The output signal HS is fed to the multiplier 8, which also receives the video signal GS. In the multiplier 8, HS is multiplied by GS to provide a corrected video signal GHS which contains data that ensures a constant exposure (E) irrespective of the ambient temperature T. Therefore, when GHS is converted to a current IS by passage through the D/A converter 6 and V/I converter 7, the light-emitting diode 11 emits radiation which provides a constant amount of exposure E for the light-sensitive material 2 irrespective of the ambient temperature T, thereby producing images of constant density.

The light-sensitive material 2 generally has a sensitivity characteristic curve as shown in FIG. 5. While the sensitivity R has a peak value at wavelength $\lambda_1$, the curve has a relatively gentle slope in the shorter wavelength region to the left of $\lambda_1$ and a steep slope in the longer wavelength side right of $\lambda_1$. This means that if the correction coefficient table 3 is a PROM having the same number of bits, accurate control over the exposure E can be realized more easily in the wavelength range to the left of the peak value than in the range to the right of the peak.

Figure 7:
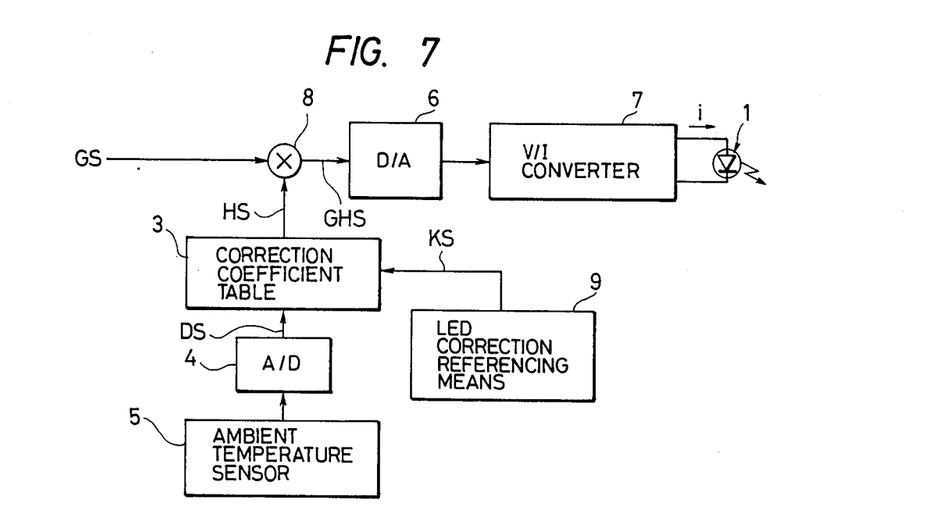
FIGS. 7 to 10 are block diagrams showing other embodiments of the diode radiation intensity correction circuit.

FIG. 7 shows another embodiment of the inventive exposure correction circuit implementing the concept of the present invention. This embodiment is so designed that not only temperature-dependent variations in the radiation intensity and center wavelength, but also variations in such factors as are inherent to a particular light-emitting diode are corrected. As shown, a light-emitting diode correction referencing device (e.g., a ten-key keyboard) 9 provides a reference signal KS which is then supplied to a correction coefficient table 3. This reference signal KS is summed with temperature data DS coming from an ambient temperature detector 5 through an A/D converter 4. The sum signal is used as an address signal, in response to which the table 3 produces a correction signal HS from a predetermined set of table data. This correction signal is subsequently processed as in the circuit of FIG. 6 to actuate the light-emitting diode 1, which radiates a constant intensity of light for producing a constant image density. The circuit of FIG. 7 is designed for compensating for a significant amount of the variations in radiation intensity that are inherent in the particular light-emitting diode used. In order to achieve this object, the inherent variations may be initially referenced by using, for example, low-order bits in the read address of the PROM.

Figure 8:
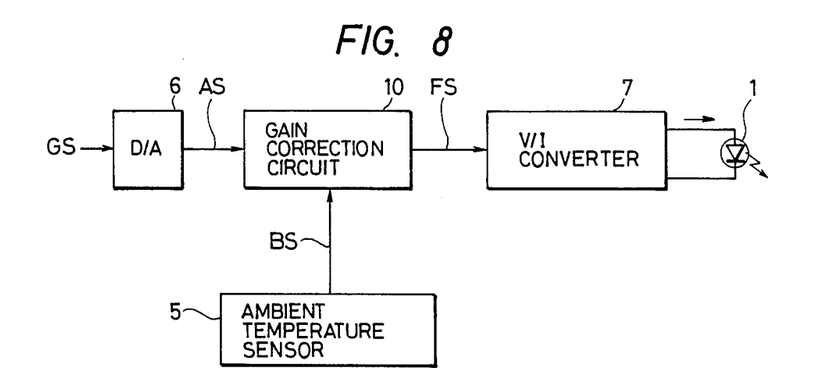

FIG. 8 shows a circuit designed for achieving simpler control over the radiation intensity of a light-emitting diode than in the case of the circuits depicted in FIGS. 6 and 7. This embodiment assumes the approximation that the portion of the curve in FIG. 5 which is to the left of the peak of sensitivity R is a straight line. Another approximation assumed for the operation of the circuit of FIG. 8 is that the radiation intensity L of the light-emitting diode 1 has such spectral characteristics that L varies linearly with the temperature T as plotted by the dashed line LN.

Referring to FIG. 8, an ambient temperature detector 5 produces an output voltage BS proportional to temperature T. The voltage output BS is fed to an analog gain correction circuit 10. A video signal GS is fed to a D/A converter 6, which delivers an analog video signal AS. This signal AS is also applied to the gain correction circuit 10, which delivers a video signal FS produced by correcting AS with the voltage BS. In the circuit 10, the analog video signal AS is gain-corrected for ambient temperature T, and the resulting signal FS is subsequently processed as in the circuits of FIGS. 6 and 7 for producing a current that actuates the light-emitting diode 1 to issue a constant intensity of radiation for eventually producing an image of constant density. The circuit of FIG. 8 depends on an approximation of the amount of correction, but one significant advantage of this circuit is that the gain correction circuit 10 may be implemented with inexpensive analog circuitry.

Figure 9:
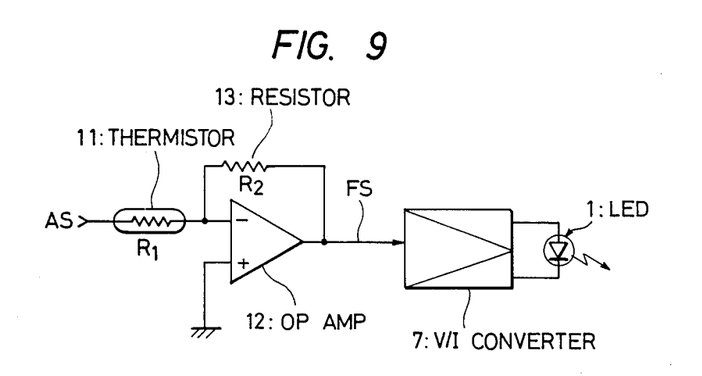

The circuit of FIG. 9 is similar to that of FIG. 8 in that the radiation intensity of the light-emitting diode 1 is corrected in an analog mode for the ambient temperature. In the circuit of FIG. 9, an analog video signal AS is supplied to an operational amplifier 12 through a negative temperature coefficient thermistor 11. The output of the amplifier 12 is fed back to its inverting input through a resistor 13. The amplifier 12 produced a corrected video signal FS having a gain K represented by the following formula:

$$K = R_2/R_1$$

$R_1$: the resistance of thermistor 11;
$R_2$: the resistance value of feedback resistor 13.

As the temperature increases, the resistance of thermistor $R_1$ decreases and the gain K increases so that a larger current will flow into the light-emitting diode 1 through the V/I converter circuit 7, thus enabling the diode to radiate a stronger light. Therefore, a substantially constant amount of exposure can be obtained from the light-emitting diode 1 by selecting a thermistor whose resistance $R_1$ has a negative temperature coefficient appropriate to compensate for any reduction in the radiation intensity of the diode.

Figure 10:
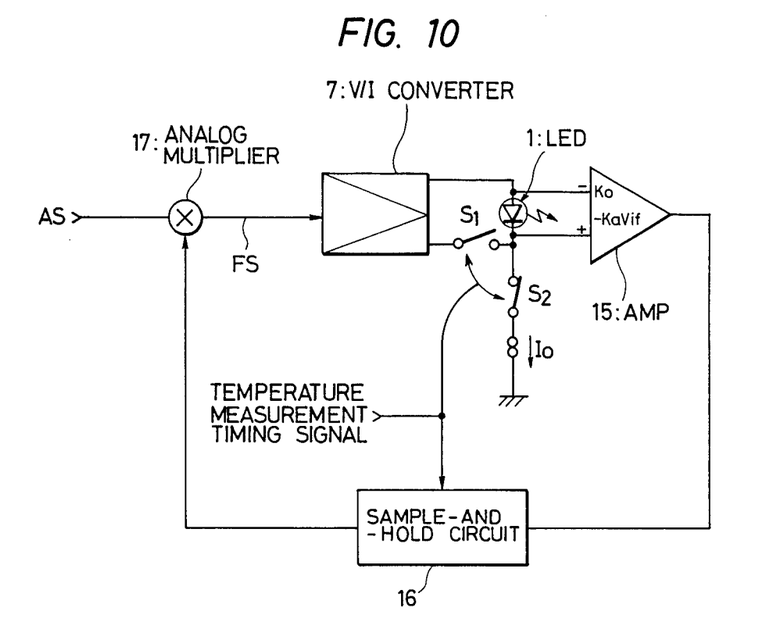
Figure 11:
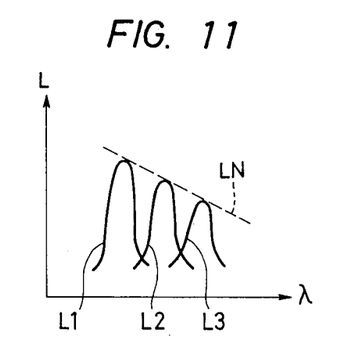

FIG. 10 shows a circuit that performs feedback control over the current supplied to the light-emitting diode 1. This circuit makes use of the principle that when a constant current flows through a p-n junction type light-emitting device such as an LED, a voltage drop $V_{if}$, namely, the forward bias applied across the p-n junction, decreases in proportion to the temperature of the junction $T_j$.

The circuit has the following configuration: a normally closed switch $S_1$ is connected between the cathode of the light-emitting diode 1 and the V/I converter 7, while the cathode of the diode 1 is grounded through a normally open switch $S_2$; the anode voltage of the diode 1 is fed to the inverting input of a differential amplifier 15 and the cathode voltage to the non-inverting input; the differential amplifier 15 amplifies the forward voltage drop $V_{if}$ between the anode and cathode of the diode 1 to $K = K_o - K_a \cdot V_{if}$ (K: output, $K_o$ and $K_a$ are arbitrary constants); the output K of the amplifier 15 is fed to a sample-and-hold circuit 16 which samples K at fixed intervals and produces K′ after holding for a predetermined period. The output K′ is applied to an analog multiplier 17 and is multiplied there by an analog video signal AS.

This circuit is operated by the following procedures: Immediately before video recording, for example, in the blanking period of raster scanning, a switch $S_1$ is opened and a switch $S_2$ closed in response to a temperature sensing timing signal B, causing a constant current $I_o$ to flow through the light-emitting diode 1. The resulting forward voltage drop $V_{if}$ is amplified to $K = K_o - K_a \cdot V_{if}$ by the amplifier 15. The output K is sampled and held in the circuit 16 by the timing signal B, and the output K' from the circuit 16 is fed to the multiplier 17 where it is multiplied by the analog video signal AS so as to carry out the necessary correction of the current flowing through the diode 1. As the temperature increases, the value of $V_{if}$ decreases and K increases, causing a larger current to flow through the diode 1, thereby increasing its radiation intensity. In the embodiment described above, the light-emitting diode 1 acts as a temperature sensor so that more precise control of the radiation intensity can be realized.

The light-sensitive material to be processed by the method of the present invention is hereunder described. Any of the silver salt and non-silver salt light-sensitive materials may be processed by the present invention. Illustrative non-silver salt light-sensitive materials include those using electrophotographic photoreceptors such as zinc oxide and selenium, and those using photopolymers. Spectrally sensitizable non-silver salt materials are preferred. Exemplary silver salt light-sensitive materials include those using inorganic silver salts such as silver halides, and those using organic silver salts in addition to such inorganic silver salts. Again, spectrally sensitizable silver salt materials are preferred. Silver salt light-sensitive materials may be processed for image formation either by the dry or wet method. Silver salt light-sensitive materials may be black-and-white materials using couplers or mobile dye imparting substances as color image forming materials.

Silver halide emulsions used in silver halide light-sensitive materials may be selected from among those described in "Shashin Kogaku no Kiso (Fundamentals of Photographic Enginerring)", *Silver Salt Photography*, pp. 240–268, published by Corona-sha, 1979.

Examples of the light-sensitive materials designed for processing by the dry method are described in, for example, "Shashin Kogaku no Kiso", ibid., pp. 553–555; *Eizo Joho* (Video Information), p. 40, April 1978; *Neblette's Handbook of Photography and Reprography*, 7th ed., Van Nostrand Reinhold Company, pp. 32–33; U.S. Pat. Nos. 3,152,904, 3,301,678, 3,392,020, and 3,457,075; British Pat. Nos. 1,131,108 and 1,167,777; *Research Disclosure*, June 1978, pp. 9–15 (RD-17029).

In accordance with the present invention, silver may be used as an image-forming material. In case of electrophotographic materials, carbon-based toners may be used as image-forming materials. Couplers that form color images by reaction with the oxidized products of developing agents may also be used as image-forming materials; they include magneta couplers such as 5-pyrazolone coupler, pyrazolobenzimidazole coupler, cyanoacetylcoumarone coupler and open-chain acylacetonitrile coupler; yellow couplers such as acylacetamide couplers (e.g., benzoylacetanilides and pyvaloylacetanilides); cyan couplers such as naphthol coupler and phenol coupler. It is preferred that these couplers either be rendered non-diffusible by incorporating a hydrophobic "ballast" group in the molecule or polymerized. The couplers may be four- or two-eqivalent with respect to silver ions. Colored couplers capable of color correction or DIR couplers that release a development restrainer during development may also be used.

Other usable image-forming materials include dyes that form color images by the silver dye bleach process, for example, the dyes described in *Research Disclosure*, April 1976, pp. 30–32 (RD-14433), *Research Disclosure*, December 1976, pp. 14–15 (RD-15227), and U.S. Pat. No. 4,235,957; and the leuco dyes described in U.S. Pat. Nos. 3,985,565 and 4,022,617.

The dyes carrying a nitrogen-containing heterocyclic group as described in *Research Disclosure*, May 1978, pp. 54–58 (RD-16966) may also be used as image-forming materials.

Dye imparting substances are other candidates for image-forming materials, and they include compounds that release a mobile dye upon coupling reaction at elevated temperatures with a reducing agent that has been oxidized by redox reaction with a silver halide or an organic silver salt (these types of compounds are described in Euorpean Pat. No. 70,056, German Pat. No. 3,217,853, and European Pat. No. 67,455), and compounds that release a mobile dye as a result of redox reaction with a silver halide or an organic silver salt at elevated temperatures (these types of compounds are described in European Pat. No. 76,492, German Pat. No. 3,215,485, European Pat. No. 66,282, Unexamined Published Japanese Patent Application Nos. 154445/1984 and 152440/1984).

The preferred dye imparting substances are respresented by the following formula (I):

$$(\text{Dye'X})_q - Y \qquad (\text{I})$$

In formula (I), Dye represents a dye that becomes mobile upon release from the molecule, dyes having a hydrophilic group are preferred. Usable dyes include azo, azomethine, anthraquinone, naphthoquinone, styryl, nitro, quinoline, carbonyl and phthalocyanine dyes. The spectral absorption of these dyes may be shifted temporarily to shorter wavelength in order to regenerate the desired image color during development. Specific examples of Dye are described in European Patent Application No. 76,492.

In formula (I), X represents a simple bond or a linkage such as —NR— (R: hydrogen, alkyl or substituted alkyl), —SO₂—, —CO—, alkylene, substituted alkylene, phenylene, substituted phenylene, naphthylene, substituted naphthylene, —O—, —SO—, and combination thereof.

In formula (I), Y represents a group that releases Dye either in areas where light-sensitive silver halide grains carry a latent image or in areas other than such areas, so that the released Dye differs in diffusibility from the compound represented by Dye—X —Y.

Specific examples of the dye imparting substances represented by formula (I) are given in Unexamined Published Japanese Patent Application No. 168439/1984 and may be illustrated by the following:

-continued (8)

(9)

(10)

(11)

(12)

(13)

-continued (14)

(15)

(16)

The light-sensitive materials, preferably silver halides, to be processed by the present invention are desirably spectrally sensitized by methine dyes, such as cyanine, merocyanine, complex cyanine, complex merocyanine, holopolar cyanine, hemicyanine, styryl and hemioxonol dyes. Particularly useful dyes are cyanine, merocyanine and complex merocyanine dyes. These dyes may incorporate any of the nuclei that are commonly used in cyanine dyes as basic heterocyclic nuclei. Suitable nuclei include pyrroline, oxazoline, thiazoline, pyrrole, oxazole, thiazole, selenazole, imidazole, tetrazole and pyridine nuclei; these nuclei having alicyclic hydrocarbon rings fused thereto; these nuclei having armoatic hydrocarbon rings fused thereto, such as indolenine, benzindolenine, indole, benzoxazole, naphthoxazole, benzothiazole, naphthothiazole, benzoselenazole, benzimidazole and quinoline nuclei, which may be substituted on any carbon atom.

Merocyanine or complex merocyanine dyes may incorporate 5- or 6-membered heterocyclic nuclei having a ketomethylene structure, such as pyrazoline-5-one, thiohydantoin, 2-thioxazolidine-2,4-dione, thiazolidine-2,4-dione, rhodanine and thiobarbituric acid nuclei.

The sensitizing dyes listed above may be used either alone or in combination, and combined sensitizing dyes are often used for the purpose of supersensitization. Typical examples of dye combinations used for this purpose are described in U.S. Pat. Nos. 2,688,545, 2,977,299, 3,397,060, 3,522,052, 3,527,641, 3,671,293, 3,628,964, 3,666,480, 3,672,898, 3,679,428, 3,703,377, 3,769,301 3,814,609, 3,837,862, and 4,026,707; British Pat. Nos. 1,344,281, and 1,507,803; Japanese Patent Publications Nos. 4936/1968 and 12,375/1978; and Unexamined Japanese Patent Applications Nos. 110,618/1977 and 109,925/1977.

In addition to these sensitizing dyes, emulsions may incorporate dyes that have no spectral sensitizing effects, or substances that are substantially incapable of absorbing the visible part of the spectrum and which exhibit supersensitizing action. Examples of such dyes or substances are aminostyryl compounds substituted by nitrogen-containing heterocyclic groups (e.g., those described in U.S. Pat. Nos. 2,933,390 and 3,635,721), the condensation products of aromatic organic acids and formaldehyde (e.g., those described in U.S. Pat. No. 3,743,510), cadmium salts and azaindene compounds. Particularly useful combinations are described in U.S. Pat. Nos. 3,615,613, 3,615,641, 3,617,295 and 3,635,721.

In accordance with the present invention, the wavelength for maximum sensitivity of such spectrally sensitized light-sensitive material is rendered to be substantially equal to the center wavelength for the possible variations in the peak spectral radiation of the semiconductor light source used for exposure. If the light-sensitive material to be processed by the present invention is a multi-layered color photographic material having a plurality of spectrally sensitized regions, the respective sensitized regions in each layer may overlap each other as a result of making the wavelength for maximum sensitivity of such material substantially equal to the center wavelength for the possible variations in the peak spectral radiation of the semiconductor light source. In order to avoid this problem, the sensitive layers, intermediate layers, filter layers or protective layer may be treated with dyes.

A particularly preferred embodiment of the present invention uses the combination of silver halides and organic silver salt oxidants in the light-sensitive material. Organic silver salt oxidants are those compounds which, when heated at temperatures of 80° C. or higher, preferably at 100° C. or higher, in the presence of exposed silver halides, form silver images by reacting with any of the image-forming materials described above or with reducing agents that may be used in combination with such image-forming materials. By using such organic silver salt oxidants in combination with silver halides, light-sensitive materials that will provide colors of higher density may be obtained.

When silver halides are used in combination with organic silver salt oxidants, such halides need not contain pure silver iodide crystals as in the case where they are used alone, and may contain every type of silver halides that are known in the art, such as silver chloride, silver chlorobromide, silver chloroiodide, silver bromide, silver iodobromide, silver chloroiodobromide and silver iodide.

Two or more silver halides which differ in size and/or composition may be used in the present invention.

The silver halide grains used in the present invention preferably range from 0.001 to 10 microns, more preferably from 0.001 to 5 microns, in average size.

The silver halides used in the present invention may be used as they are after being chemically sensitized with chemical sensitizers such as compounds of sulfur, selenium or tellurium or compounds of gold, platinum, palladium, rhodium or iridium; reducing agents such as tin halide; or combinations of these compounds. More detailed information of chemical sensitization is found in "The Theory of the Photographic Process", 4th ed., edited by T. H. James, Macmillan Publishing Co., Ltd., Chapter 5, pp. 149–169.

In the process of the present invention, the light-sensitive halides are coated in amounts which usually range from 1 mg to 10 g/m$^2$ of silver.

Examples of the organic silver salt oxidants are described in Unexamined Published Japanese Patent Application No. 58543/1983, and several of them are shown below.

The first example is silver salts of organic compounds having a carboxyl group and typical examples of these salts are those of aliphatic carboxylic acids and aromatic carboxylic acids. The second example is silver salts of compounds having a mercapto or thion group, and derivatives of such compounds. The third example is silver salts of compounds having an imino group, such as silver salts of benzotriazole and derivatives thereof as described in Japanese Patent Publication Nos. 30270/1969 and 18416/1970; more specific examples are silver salts of benzotriazole, silver salts of alkyl-substituted benzotriazoles such as methyl benzotriazole, silver salts of halogen-substituted benzotriazole such as 5-chlorobenzotriazole, silver salts of carboimidobenzotriazole such as butylcarboimidobenzotriazole, silver salts of 1,2,4-triazole or 1-H-tetrazole as described in U.S. Pat. No. 4,220,709, silver salts of carbazole, silver salts of saccharin, and silver salts of imidazole or imidazole derivatives. The fourth example is the silver salts as described in *Research Disclosure* No. 170-17029. Organic metal salts such as copper stearate may also be used.

The processes for preparing these silver halides and organic silver salts and the methods for mixing them are described in *Research Disclosure* No. 170-17029, Unexamined Published Japanese Patent Applications Nos. 32928/1975, 42529/1976, 13224/1974, 17216/1975, and U.S. Pat. No. 3,700,458.

The light-sensitive silver halides and organic silver salts are preferably coated in total amounts ranging from 50 mg to 10 g/m$^2$ as silver.

Reducing agents may be used in combination with the image-forming materials described above, and examples of such reducing agents include the following: hydroquinone compounds (e.g., hydroquinone, 2,5-dichlorohydroquinone and 2-chlorohydroquinoe), aminophenolic compounds (e.g., 4-aminophenol, N-methylaminophenol, 3-methyl-4-aminophenol and 3,5-dibromoaminophenol), catechol compounds (e.g., catechol, 4-cyclohexylcatechol, 3-methoxycatechol and 4-(N-octadecylamino)catechol), phenylenediamine compounds (N,N-diethyl-p-phenylenediamine, 3-methyl-N,N-diethyl-p-phenylenediamine, 3-methoxy-N-ethyl-N-ethoxy-p-phenylenediamine and N,N,N',N'-tetramethyl-p-phenylenediamine), 3-pyrazolidone compounds (e.g., 1-phenyl-3-pyrazolidone, 1-phenyl-4,4-dimethyl-3-pyrazolidone, 4-hydroxymethyl-4-methyl-1-phenyl-3-pyrazolidone, 1-m-tolyl-3-pyrazolidone, 1-p-tolyl-3-pyrazolidone, 1-phenyl-4-methyl-3-pyrazolidone, 1-phenyl-5-methyl-3-pyrazolidone, 1-phenyl-4-methyl-3-pyrazolidone, 1-phenyl-5-methyl-3-pyrazolidone, 1-phenyl-4,4-bis-(hydroxymethyl)-3-pyrazolidone, 1,4-di-methyl-3-pyrazolidone, 4-methyl-3-pyrazolidone, 4,4-dimethyl-3-pyrazolidone, 1-(3-chlorophenyl)-4-methyl-3-pyrazolidone, 1-(4-chlorophenyl)-4-methyl-3-pyrazolidone, 1-(4-tolyl)-4-methyl-3-pyrazolidone, 1-(2-tolyl)-4-methyl-3-pyrazolidone, 1-(4-tolyl)-3-pyrazolidone, 1-(3-tolyl)-3-pyrazolidone, 1-(3-tolyl)-4,4-dimethyl-3-pyrazolidone, 1-(2-trifluoroethyl)-4,4-dimethyl-3-pyrazolidone and 5-methyl-3-pyrazolidone.

These reducing agents are generally used in amounts of 0.01–20 moles, preferably 0.1–10 moles, per mole of silver.

In accordance with the present invention, reductive dye-imparting substances may even be used in combination with what are generally called auxiliary developing agents which are oxidized by silver halide to yield a product having the ability to oxidize the reductive substrate in the dye imparting substance.

Useful auxiliary developing agents include hydroquinone; alkyl-substituted hydroquinones such as t-butylhydroquinone and 2,5-dimethylhydroquinone; catechols; pyrogallols; halogen-substituted hydroquinones such as chlorohydroquinone and dichlorohydroquinone; alkoxy-substituted hydroquinones such as methoxyhydroquinone; and polyhydroxybenzene derivatives such as methyl hydroxynaphthalene. Other useful examples include methyl gallate; ascorbic acid; ascorbic acid derivatives; hydroxylamines such as N,N'-di'-(2-ethoxyethyl)hydroxylamine; pyrazolidones such as 1-phenyl-3-pyrazolidone and 4-methyl-4-hydroxymethyl-1-phenyl-3-pyrazolidone; reductones; and hydroxytetronic acids.

The image-forming materials used in the present invention may be incorporated into layers in the light-sensitive material by any of the conventional methods such as those described in U.S. Pat. No. 2,322,027. For example, the image-forming materials may be dispersed in hydrophilic colloids after they are dissolved in organic solvents which may have either higher or lower boiling points. Illustrative higher-boiling organic solvents include alkyl esters of phthalic acid (e.g., dibutyl phthalate and dioctyl phthalate), phosphate esters (e.g., diphenyl phosphate, triphenyl phosphate, tricresyl phosphate and dioctylbutyl phosphate), citrate esters (e.g., tributyl acetylcitrate), benzoate esters (e.g. octyl benzoate), alkylamides (e.g., diethyl laurylamide), fatty acid esters (e.g., dibutoxyethyl succinate and dioctyl azelate), trimesic acid esters (e.g., tributyl trimesate). Illustrative lower-boiling organic solvents are those having melting points of about 30°–160° C., such as lower alkyl acetates (e.g., ethyl acetate and butyl acetate), ethyl propionate, secondary butyl alcohol, methyl isobutyl ketone, β-ethoxyethyl acetate, methyl cellosolve acetate and cyclohexanone. The higher-boiling and lower-boiling organic solvents shown above may be used in admixtures.

The image-forming materials may also be dispersed with the aid of polymers as described in Japanese Patent Publication No. 39853/1976. A variety of surfactants may also be used in order to facilitate the dispersion of image-forming materials within hydrophilic colloids. A suitable surfactant is disclosed in Examples 2 and 3 to be shown later in this specification.

The higher-boiling organic solvents are generally used in amounts not exceeding 10 g, preferably no more than 5 g, per gram of the image-forming material used.

Dye release aids may be used in the present invention, and preferred dye release aids are bases and base precursors. Such dye release aids may be incorporated either in the light-sensitive material or in a dye fixing material. If the dye release aid is incorporated in the light-sensitive material, a base precursor may be used as the aid with particular advantage. The term "base precursor" as used herein means compounds that release a basic component upon heating, and the basic component to be released may be an inorganic or organic base.

Preferred inorganic bases include hydroxides, secondary or tertiary phosphates, borates, carbonates, quinolinates and metaborates of alkali metals or alkaline earth metals; ammonium hydroxide; hydroxides of quaternary alkyl ammonium; and other metal hydroxides. Preferred organic bases include aliphatic amines, aromatic amines, heterocyclic amines, amidines, cyclic amidines, guanidines and cyclic guanidines. Bases having pKa values of 8 or higher are particularly advantageous.

Preferred base precursors are those compounds which will release bases through certain reactions initiated by heating, and they include salts or organic acids and bases that decompose upon heating through removal of carbon dioxide, as well as compounds which will release amines as a result of decomposition by such reactions as intramolecular nucleophilic substitution, Lossen rearrangement and Beckmann rearrangement. Illustrative preferred base precursors are listed below: trichloroacetic acid salts as described in British Pat. No. 998,949; α-sulfonylacetic acid salts as described in U.S. Pat. No. 4,060,420; propiolic acid salts as described in Unexamined Published Japanese Patent Application No. 180537/1984; 2-carboxycarboxamide derivatives as described in U.S. Pat. No. 4,088,496; salts of heat-decomposable acids with basic components which contain alkali metals or alkaline earth metals in addition to organic bases as described in Unexamined Published Japanese Patent Application No. 195237/1984; hydroxamcarbamates that release bases upon Lossen rearrangement as described in Unexamined Published Japanese Patent Application No. 168440/1984; and aldoxime carbamates that form nitrile upon heating as described in Unexamined Published Japanese Patent Application No. 157637/1984. Other useful base precursors are described in British Pat. No. 998,945, U.S. Pat. No. 3,220,846, Unexamined Published Japanese Patent Application No. 22,625/1975 and British Pat. No. 2,079,480.

Particularly useful base precursors are listed below: guanidine trichloroacetate, guanidine methyl trichloroacetate, potassium trichloroacetate, guanidine phenylsulfonylacetate, guanidine p-chlorophenylsulfonylacetate, guanidine p-methanesulfonylphenylsulfonylaceate, potassium phenylpropiolate, cesium phenylpropiolate, guanidine phenylpropiolate, guanidine p-chlorophenylpropiolate, guanidine 2,4-dichlorophenylpropiolate diguanidine p-phenylene-bis-propiolate, tetramethyl ammonium phenylsulfonylacetate, and tetramethyl ammonium phenylpropiolate.

The light-sensitive material to be processed by the present invention comprises a support on which light-sensitive layers, for example, silver halide photographic emulsion layers, are deposited. Each of the sensitive layers may consist of multiple layers. One embodiment of the case where the light-sensitive material to be processed by the present invention is a color photographic material is such that red-sensitive, green-sensitive and blue-senstive layers coated in the stated order on a support. Alternatively, infrared-sensitive, red-sensitive and green-sensitive layers may be coated in this order on a support. In either case, the respective sensitive layers preferably form cyan, magenta and yellow color images. Each of the light-sensitive layers may consist of two or more layers, or they may be separated by an intermediate layer or a filter layer. A protective layer may be disposed farthest from the support. The above are not the only examples of the spectral sensitivity and color image forming characteristics of the light-sensitive layers in the photographic material. Other combinations may be used, wherein an infrared-sensitive layer forms a magenta color image, a red-sensitive layer forms a cyan color image, and a green-sensitive layer forms a yellow color image, or alternatively, an infrared-sensitive layer forms a magenta color image, a green-sensitive layer forms a cyan color image, and a blue-sensitive layer forms a yellow color image. The respective light-sensitive layers may be coated on a support in orders different from those shown above; for example, red-sensitive, green-sensitive and infrared-sensitive layers are coated in this order, or alternatively blue-sensitive, red-sensitive and green-sensitive layers may be coated in this order.

In a preferred embodiment, the light-sensitive material to be processed by the present invention uses as a light-sensitive material a silver halide that has been spectrally sensitized by one or more of the spectral sensitizing dyes described above, and uses as an image-forming material either a coupler that forms a dye upon reaction with the oxidized product of a developing agent, or a dye-imparting substance, preferably a compound of formula (I), that releases a mobile dye as a result of redox reaction with the silver halide or an organic silver salt at elevated temperatures. When the dye imparting substance is used, the light-sensitive material is given an imagewise exposure and then heated (thermally developed) to form an image, which is transferred onto a superimposed dye fixing material. The formation of image by heating and the subsequent transfer of the image may be effected by a single step.

The dye fixing material to which the developed image is transferred consists of a support carrying a dye fixing layer, and an optional while colored reflecting layer containing a white pigment such as titanium dioxide. The dye fixing layer contains a binder and a mordant that is necessary for dye fixation. Preferred mordants are those having molecular weights ranging from 5,000 to 200,000, especially 10,000 to 50,000, such as polymers containing secondary or tertiary amino groups, polymers having a nitrogen-containing heterocyclic group, and polymers having a quaternary cationic group. In addition to these mordants, the dye fixing layer may contain a base, a base precursor or a hot solvent. Light-sensitive layers containing light-sensitive materials and a dye fixing layer may be provided on the same support.

Single or combined binders may be used in the light-sensitive material to be processed by the present invention. Hydrophilic binders are generally used. Typical hydrophilic binders are either transparent or translucent and include natural substances such as proteins (e.g., gelatin, gelatin derivatives and cellulose derivatives) and polysacchrides (e.g., starch and gum arabic), as well as synthetic polymeric substances such as water-soluble polyvinyl compounds (e.g., polyvinyl pyrrolidone and acrylamide polymers). Other synthetic polymeric substances are latices of dispersed vinyl compounds which are particularly effective in increasing the dimensional stability of photographic materials.

Compounds having the capabilities of not only development activation but also image stabilization may also be used in the light-sensitive material to be processed by the present invention. Preferred examples of such compounds include isothiuroniums typified by the 2-hydroxyethylisothiuronium trichloroacetate described in U.S. Pat. No. 3,301,678; bis-isothiuroniums such as the 1,8-(3,6-dioxaoctane)bis(isothiuronium trichloroacetate) described in U.S. Pat. No. 3,669,670; thiol compounds such as those described in German Patent Application (OLS) No. 2,162,174; thiazolium compounds such as 2-amino-2-thioazolium trichloroacetate and 2-amino-bromoethyl-2-thiazolium trichloroacetate as described in U.S. Pat. No. 4,012,260; compounds having α-sulfonylacetate as the acidic portion, such as bis(2-amino-2-thiazolium)methylenebis(sulfonylacetate) and 2-amino-2-thiazolium phenylsulfonylacetate as described in U.S. Pat. No. 4,060,420; and compounds having 2-carboxycarboxyamide as the acidic portion as described in U.S. Pat. No. 4,088,496.

Other preferred compounds include azole thioether and blocked azolinthion compounds as described in Belgian Pat. No. 768,071; 4-aryl-1-carbamyl-2-tetrazolin-5-thion compound as described in U.S. Pat. No. 3,893,859; and compounds of the type described in U.S. Pat. Nos. 3,839,041; 3,844,788 and 3,877,940.

The support for the light-sensitive material to be processed by the present invention and the support for the optional dye fixing material are required to withstand the normally expected processing temperatures. Generally used supports include glass, paper, metal and their analogs. Other usable supports include acetylcellulose, cellulose ester, polyvinyl acetal, polystyrene, polycarbonate and polyethylene terephthalate films, and their associated films and resin materials. Paper supports laminated with such polymers as polyethylene may also be used. The polyesters described in U.S. Pat. Nos. 3,634,089 and 3,725,070 are preferably used.

The light-sensitive material and the dye fixing material used in the present invention may incorporate inorganic or organic hardeners within photographic emulsion layers or binder layers. Illustrative hardeners include chromium salts (e.g., chrom alum and chromium acetate), aldehydes (e.g., formaldehyde, glyoxal and glutaraldehyde), N-methylol compounds (e.., dimethylourea and methyloldimethylhydantoin), dioxane derivatives (e.g., 2,3-dihydroxydioxane), active vinyl compounds (e.g., 1,3,5-triacryloyl-hexahydro-s-triazine and 1,3,-vinylsulfonyl-2-propanol) active halogen compounds (e.g., 2,4-dichloro-6-hydroxy-s-triazine); mucohalogenic acids (mucochloric acid and muco-phenoxychloric acid). These hardeners may be used either alone or in combination.

Certain agents may be used to facilitate the transfer of dyes from light-sensitive layers to the dye fixing layer. Such dye transfer assisting agents may be supplied externally or incorporated in the light-sensitive material or dye-fixing material. In the first case, water or aqueous solutions containing sodium hydroxide, potassium hydroxide, or inorganic alkali metal salts may be used as the transfer aid. Other suitable examples are low-boiling solvents such as methanol, N,N-dimethylformamide, acetone and diisobutyl ketone, or mixtures of such solvents with water or aqueous basic solutions. If desired, an image receiving layer may be wetted by such transfer aids. In the second case, the above listed transfer aids need not be supplied externally and may be incorporated in the light-sensitive material or dye fixing material in the form of either water or crystallization or microcapsules. Alternatively, such aids may be incorporated as a precursor that releases the solvent at elevated temperatures. Preferably, hydrophylic hot solvents that are solid at ordinary temperatures and dissolve at elevated temperatures may be incorporated within the light-sensitive material or dye fixing material. If desired, such hot solvents may be incorporated in both the light-sensitive material and the dye fixing material. The hot solvents may be incorporated in any photographic layer such as emulsion layers, intermediate layers, protective layer and dye fixing layer. Preferably, the solvents are incorporated in the dye fixing and/or layers adjacent thereto.

Illustrative hydrophilic hot solvents include ureas, pyridines, amides, sulfonamides, imides, alcohols, oximies, and any other compounds of the type described in Unexamined Published Japanese Patent Application No. 174834/1984.

For detailed information of other compounds that may be used in the light-sensitive material to be processed by the present invention, such as sulfamide derivatives, cationic comounds having a pyridinium group, surfactants having a polyethylene oxide chain, filter dyes, anti-halation dyes, anti-irradation dyes, hardeners and mordants, see European Pat. Nos. 76,492, 66,282, German Pat. No. 3,315,485, as well as Unexamined Published Japanese Patent Applications Nos. 154445/1984 and 152440/1984.

The silver salt light-sensitive material processed by the present invention may form either a positive or negative image depending on the type of silver halide used as the light-sensitive material. For example, in order to form a direct positive image, silver halide emulsions that form an internal latent image (as described in U.S. Pat. Nos. 2,592,250, 3,206,313, 3,367,778 and 3,447,927), or mixtures thereof with silver halide emulsions that form a surface latent image (as described in U.S. Pat. No. 2,996,382) may be used.

After exposure, the light-sensitive material may be thermally developed at temperatures generally ranging from about 80° C. to about 250° C., with the particularly useful range being between about 110° C. and 160° C. If the transfer step is included, the developed image may be transferred at temperatures ranging from the thermal development temperature to room temperature. A particularly preferred range is from about 60° C. to temperatures not higher than about 10° C. above the temperature at which thermal development is performed.

The exposed light-sensitive material may be thermally developed by a variety of means, such as by passing the material between hot plates or bringing it into contact with hot plates (as taught in Unexamined Published Japanese Patent Application No. 62635/1975), by bringing the material into contact with a rotating heated drum or heated rollers (as taught in Japanese Patent Publication No. 10791/1968), by passing the material between hot plates or bringing it into contact with hot plates (as taught in Unexamined Published Japanese Patent Application No. 62635/1975), by bringing the material into contact with a rotating heated drum or heated rollers (as taught in Japanese Patent Publication No. 10791/1968), by passing the material into hot air (as shown in Unexamined Published Japanese patent Application No. 32737/1978), by passing the material into an inert liquid medium held at a predetermined temperature, or by passing the material through a heating element as it is carried on a roller, belt or other guide members (as disclosd in Japanese Patent Publication No. 2546/1969). Direct heating of the light-sensitive material may be relaized by passing an electric current through a layer that is made of a conductive material such as graphite, carbon or metal and which is superimposed on the sensitive material (see, for example, Unexamined Published Japanese Patent Application No. 66442/1973).

Similar heating techniques may be employed in the transfer step.

As already described, the light-sensitive material to be processed by the present invention is spectrally sensitized so that the wavelength for peak spectral sensitivity is substantially equal to the center wavelength of variations in the peak spectral radiation from a light-emitting diode. When the so sensitized light-sensitive material is exposed under illumination from the light-emitting diode, any of the circuits shown in FIGS. 6 to 10, preferably those depicted in FIGS. 8 to 10, may be used in order to compensate for any adverse effects of temperature variations, thereby allowing the diode to produce light with a substantially constant radiation intensity. When the circuit shown in FIG. 8 is used, the gain (i.e., amplification factor) of the gain correction circuit 10 may be set to a suitable value depending upon any drop in the radiation intensity of light issuing from the diode 1, thereby permitting the diode to poduce light with a constant radiation intensity.

In accordance with the embodiment shown in FIG. 9, a substantially constant amount of radiation intensity and hence, exposure, can be obtained from the light-emitting diode 1 by selecting a thermistor 11 whose resistance $R_1$ has a negative temperature coefficient appropriate for any reduction in the radiation intensity of the diode.

In the embodiment of FIG. 10, a constant radiation intensity can be obtained from the diode 1 despite temperature changes by selecting the value of Ka at an appropriate level.

The following examples are provided for further illustration of the claimed invention but should not be construed as limiting.

EXAMPLE 1

Figure 12:
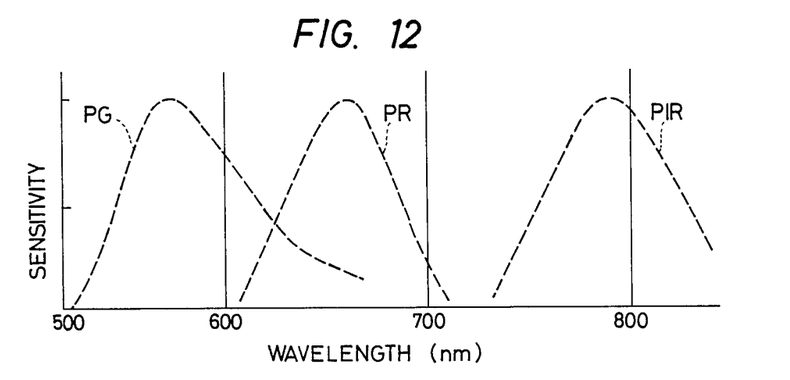
FIG. 12 is a graph showing an example of the radiation characteristics of three light-emitting diodes used in Examples 1 to 3 of the present invention.

A hundred grams of silver iodobromide emulsion (containing 5 g of gelatin and 10 g of silver) that was prepared by a conventional method was mixed with 10 ml of one of the spectral sensitizing dyes having the structural formulas (1) to (6) listed below. The dyes (1) to (4) were each dissolved in methanol to make a 0.005% solution, while the dyes (5) and (6) were each dissolved in methyl cellosolve to provide the same concentration. To each of the mixtures, an antifoggant, a hardener, a coating aid and other necessary photographic addenda were added to make a coating solution, which was applied to a polyethyleneterephthalate film support to provide a sensitive layer with a silver deposit of 5 g/m². By these procedures, six samples of light-sensitive material, A to F, were prepared. Each of the samples was exposed with an image by a scanning exposure system of the type disclosed in Unexamined Published Japanese Patent Application No. 151933/1982, and subsequently processed by conventional development and fixing steps so as to produce a black-and-white image. The radiation characteristics of the three light-emitting diodes used in exposure of the samples are depicted in FIG. 12, wherein PG represents the radiation characteristics of a GaP diode, PR depicts the characteristics of a GaAlAs diode operating with an input current of 80 mA, and PIR refers to the characteristics of a GaAlAs diode with a different composition than that above and which is operated on an input current of 80 mA.

Figure 13:
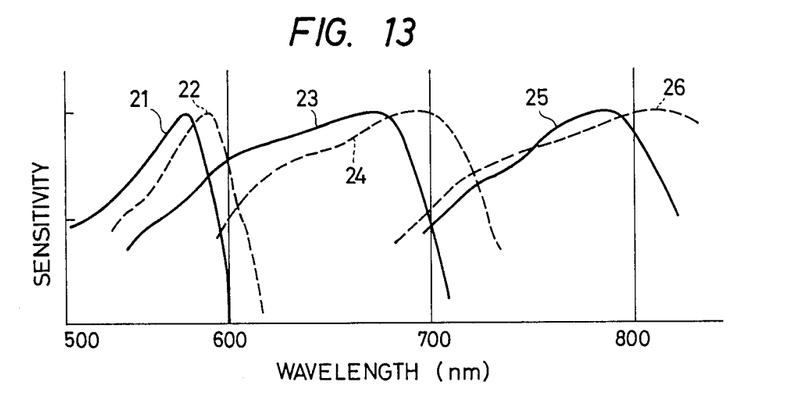
FIG. 13 is a graph showing an example of the spectral sensitivity characteristics of the light-sensitive materials prepared in Examples 1 to 3 and the comparative samples.

FIG. 13 shows the spectral sensitivity characteristics of samples A to F that were spectrally sensitized by spectral sensitizing dyes (1) to (6).

Spectral sensitizing dyes:

5.

6.

Sample A (using spectral sensitizing dye (1)), sample C (using dye (3)) and sample E (using dye (5)) were sensitized so that the wavelengths for peak sensitivity of the light-sensitive layer were rendered substantially equal to the center wavelengths of variations in the peak spectral radiation from the three light-emitting diodes. These three samples produced images having a higher density uniformity than the other samples tested, B (using dye (2)), D (using dye (4)) and F (using dye (6)).

EXAMPLE 2

Six samples, each weighing 20 g, of silver halide emulsion were prepared as in Example 1 using spectral sensitizing dyes (1) to (6). Each of the samples was mixed with 10 g of a benzotriazole emulsion prepared by the method described in Unexamined Published Japanese Patent Application No. 83154/1984, 33 g of one of the three dispersions of image-forming material prepared by the methods shown below, 10 ml of a 5% aqueous solution of guanidine trichloroacetate and 10 ml of a 5% aqueous solution of dimethylsulfonamide. The coating solutions so prepared were applied to a polyethylene terephthalate film as in Example 1 to make samples of light-sensitive material G to L.

Preparation of Dispersion of Image-forming Material (1):

Five grams of image-forming material (7), 0.5 g of sodium 2-ethylhexylsulfosuccinate, 5 g of tricresyl phosphate and 30 ml of ethyl acetate were mixed and heated to form a solution which was dispersed under agitation in 100 ml of a 10 wt% aqueous gelatin solution.

Preparation of Dispersion of Image-forming Material (2):

This dispersion was prepared as above except that 5 g of image-forming material (7) was replaced by an equal amount of image-forming material (5).

Preparation of Dispersion of Image-forming Material (3):

This dispersion was prepared by the same method as used in the preparation of Dispersion (1) except that 5 g of image-forming material (7) was replaced by 7.5 g of image-forming material (9).

| Sample | Spectral sensitizing dye (figures in parentheses indicate wavelength for peak sensitivity) | Dispersion of image-forming material |
| --- | --- | --- |
| G | 1 (570 mm) | (1) |
| H | 2 (585 mm) | (1) |
| I | 3 (670 mm) | (2) |
| J | 4 (695 mm) | (2) |
| K | 5 (785 mm) | (3) |
| L | 6 (810 mm) | (3) |

Each of the samples G to L was exposed with an image by a scanning exposure system of the type described in Unexamined Published Japanese Patent Application No. 151933/1982. The three light-emitting diodes used for the exposure had radiation characteristics which were identical to those shown in FIG. 12.

Each of the exposed samples was thermally developed at about 150° C. and a dye fixing material prepared by the method described below was superimposed on the developed sample so as to transfer the developed image onto the image-receiving layer. Thereafter, the dye fixing material carrying the transferred imge was peeled off the light-sensitive material.

Preparation of Fixing Material:

Ten grams of polymethyl acrylate-co-N,N,N-trimethyl-N-vinyl-benzylammonium chloride) (the ratio of methyl acrylate to vinyl-benzylammonium chloride=1:1) was dissolved in 200 ml of water, and the solution was mixed with 100 g of a 10 wt% lime-treated gelatin. This mixture was coated onto a paper support laminated with $TiO_2$ dispersed polyethylene. The web was dried to make a dye fixing material.

Sample G (using spectral sensitizing dye (1)), sample I (using dye (3)) and sample K (using dye (5)) were sensitized so that the wavelengths for peak sensitivity of the light-sensitive layer were rendered to become substantially equal to the center wavelengths of variations in the peak spectral radiation from the three light-emitting diodes. These three samples produced images having a higher uniformity in density than the other samples tested, H (using dye (2)), J (using dye (4)) and L (using dye (6)).

EXAMPLE 3

Two samples of multi-layered light-sensitive material M and N were prepared by combining as shown below the three light-sensitive layers used in Example 2.

| Sample | Order of coating light-sensitive layers on support | Spectral sensitizing dye (figures in parentheses indicate the wavelength for peak sensitivity) | Dispersion of image-forming material |
| --- | --- | --- | --- |
| M | 1 | 5 (785 nm) | 3 |
|   | 2 | 3 (670 nm) | 2 |
|   | 3 | 1 (570 nm) | 1 |
| N | 1 | 6 (810 nm) | 3 |
|   | 2 | 4 (695 nm) | 2 |
|   | 3 | 2 (585 nm) | 1 |

Each of the samples was exposed, thermally developed and transferred to a dye fixing material as in Example 2. The image formed from sample M was more uniform in density and had a better color balance than the image formed from sample N.

ADVANTAGES OF THE INVENTION

As described above, in accordance with the method of the present invention, the radiation intensity of a light-emitting diode is controlled taking into consideration both the radiation characteristics of the diode and the sensitivity characteristics of the light-sensitive material to be exposed under illumination from the diode. By using the method of the present invention, an accurate and constant amount of exposure can be obtained despite variations in the ambient temperature at which the diode is used. As a result of constant exposure, any variations in image density and any distortion in its color balance can be avoided. The method of the invention may be simply modified as shown in FIG. 7 to have the capability of compensating for any variations in the characteristics of light-emitting diodes used. This object may be achieved by using a less costly circuit as shown in FIG. 8.

We claim:

1. In an image forming method wherein a light-sensitive material having spectral sensitivity characteristics with a peak value is exposed under a semiconductor light source, the improvement comprising:
rendering a center wavelength of variations in peak spectral radiation due to variation of temperature from said light source substantially equal to a wavelength for peak spectral sensitivity of said light-sensitive material, and compensating any temperature-dependent variations in said radiation intensity of said light source.

2. The image forming method according to claim 1, wherein said radiation intensity of said light source is corrected in response to a signal of ambient temperature as measured by a temperature sensor.

3. An image forming method according to claim 1, wherein the step of compensating any temperature-dependent variations in said radiation intensity of said semiconductor light source comprises: detecting temperature variations of a temperature of said light source by measurement of change in a forward bias applied to said light source; and compensating for any variation in said temperature of said light source in response to thus-detected temperature variations.

* * * * *